United States Patent
Sin

(10) Patent No.: US 8,217,823 B2
(45) Date of Patent: Jul. 10, 2012

(54) METHOD FOR CONVERTING ANALOG DATA INTO DIGITAL DATA FOR ANALOG INPUT MODULE

(75) Inventor: Yong Gak Sin, Anyang-si (KR)

(73) Assignee: LS Industrial Systems Co., Ltd., Anyang-Si, Gyeonggi-Do (KR)

( * ) Notice: Subject to any disclaimer, the term of this patent is extended or adjusted under 35 U.S.C. 154(b) by 29 days.

(21) Appl. No.: 12/975,257

(22) Filed: Dec. 21, 2010

(65) Prior Publication Data

US 2011/0156941 A1      Jun. 30, 2011

(30) Foreign Application Priority Data

Dec. 30, 2009  (KR) .................. 10-2009-0134682

(51) Int. Cl.
*H03M 1/12* (2006.01)
(52) U.S. Cl. ........................ 341/155; 341/120
(58) Field of Classification Search .......... 341/155, 341/120, 156, 170, 107, 118, 158, 169, 139, 341/116; 375/232, 340

See application file for complete search history.

(56) References Cited

U.S. PATENT DOCUMENTS 7,999,793 B2 *   8/2011   Wang ......................... 345/173

* cited by examiner

*Primary Examiner* — Joseph Lauture
(74) *Attorney, Agent, or Firm* — Lee, Hong, Degerman, Kang & Waimey

(57) ABSTRACT

A method for converting analog data into digital data for analog input module is disclosed, wherein the analog input module adds at least one or more digital data determined at previous conversion periods ($k-1^{th}$, ... $k-d^{th}$, said k and d being a natural number) to n numbers of digital data converted to the current conversion period ($k^{th}$), and determines a value corresponding to a mean level in size among the digital data as a final digital conversion value of the current conversion period ($k^{th}$), and outputs the value, and as a result, even if the n numbers of digital data converted to the current conversion period ($k^{th}$) are greatly deviated from an original value by noise, a stable result having a minimum influence by the noise can be provided in industrial sites where many noises are introduced, by allowing a digital data value approximate to the original value to be outputted.

2 Claims, 3 Drawing Sheets

METHOD FOR CONVERTING ANALOG DATA INTO DIGITAL DATA FOR ANALOG INPUT MODULE

Pursuant to 35 U.S.C. §119 (a), this application claims the benefit of earlier filing date and right of priority to Korean Patent Application No. 10-2009-0134682, filed on Dec. 30, 2009, the contents of which are hereby incorporated by reference in their entirety.

BACKGROUND OF THE DISCLOSURE

1. Field

The present disclosure relates to a method for converting analog data into digital data for analog input module, and more particularly, to a method for converting analog data to digital data for analog input module configured to stably output a digital data by minimizing the influence of noise inputted along with analog data.

2. Background

An analog input module employing an ADC (Analog-to-Digital Converter) has been widely used in industrial fields. The analog input module is susceptible to data variation according to installation environment, and the stability of conversion data can be damaged by noisy environment. Recently, many technologies have been proposed to prevent the stability of conversion data from being damaged.

The conventional technique as described above is disclosed in for example Japanese Laid-open Patent Publication No. 2000-068833 (Published on Mar. 3, 2000). The technique teaches a digital filter system consisting of an A/D converter and a means that eliminates extremely larger (or smaller) data among conversion data by the number of times of sampling extracted by over-sampling and averages the remaining data, whereby noise patterns generated by environments can be digitally eliminated.

In the conventional analog input module including the digital filtering system, several analog-to-digital conversions are generally performed to stabilize the conversion data, and a stable data is selected from among a plurality of conversion data. For example, in a module that has obtained a time for three times of conversion, an average value except for the maximum and minimum values from results of three times of conversion is displayed as an analog-to-digital conversion value. Alternatively, an average value from the results of the three times of conversion may be displayed as an analog-to-digital conversion value.

However, there is a drawback in the conventional analog input module in that conversion times must be increased to enhance stability of conversion data. This is because the data conversion time increases in proportion to the conversion times (n) and therefore, the conversion times (n) must be solved within a given conversion speed of the module. As a result, the data stability cannot be conventionally pursued through increased conversion times if a product is enabled to realize by determining the conversion times (n) within a conversion speed of an allowed product specification.

For example, assuming that a conversion speed of a specification is 100 µs and a conversion speed of an analog input module to be applied is 30 µs, maximum allowable conversion times of the analog input module is 3 times. Assuming that an ideal digital conversion data to the exemplified analog input module is 1,000, a satisfactory result may be obtained, because an average of three input data is 1,000, as the three times of conversion data is respectively 998, 1002, and 1000.

However, in case conversion data of 950, 1000, and 1002 is inputted, an average of the three data becomes 984 due to influence by noise, such that an unsatisfactory result can be obtained against a conversion data desired by a user.

Therefore, in order to avoid the above-mentioned situations, a designer may select a method of selecting an average (mean) value that dispenses with maximum and minimum values. However, even in this case, if two continuous values are affected by noise, a result desired by the designer cannot be achieved. Therefore, it is very difficult to expect any higher stability unless the conversion times (n) is increased. Furthermore, increased conversion times (n) inevitably increases data conversion time to result in a problem of failing to satisfy a conversion speed specified by the specification. As a result, there may occur a case of correcting hardware in the worst case, and if the case ever occurs, it is inevitable to increase the time and cost.

Alternatively, among methods of stabilizing conversion data in the analog input module, there may be a method of stabilizing data, considering that a change has occurred to a data only when the change to a lowest level bit in an analog-to-digital converter is greater than a predetermined level. This method has borrowed a hysteresis characteristic to an input signal, the method of which is responsive only to a case where data fluctuation is greater than a predetermined value, such that a fluctuation unit of the data is recognized as the predetermined value. Therefore, there may be generated a phenomenon where the data fluctuates to show a stair shape in a width of the predetermined value, to thereby create a problem of a fine control being inappropriate.

In order to obviate one or more of the above-mentioned problems, a digital conversion method appropriate both to a fine control and to stability of conversion data has been required by the relevant conventional prior art, free from fluctuations in conversion times, conversion speed and conversion time in an analog input module.

SUMMARY

The present disclosure relates to a method for converting an analog data into a digital data for an analog input module.

According to the present disclosure, a method for converting an analog data into a digital data for an analog input module is performed, where an analog input module converts an analog data inputted as many as a predetermined n times for each data conversion period to a digital data, and based on the converted n numbers of digital data and a current conversion period ($k^{th}$), at least one or more final conversion data determined to a previous conversion period ($k-1^{th}, \ldots k-d^{th}$, where d is a natural number) are sorted in the order of size, and a value corresponding to a mean level among the sorted data is determined and outputted as a final conversion data of the current conversion period ($k^{th}$).

As a result, influence of noise inputted to the analog input module can be minimized to stably output a digital data relative to an analog data.

Therefore, it is an object of the present disclosure a method for converting analog data to digital data for analog input module configured to stably output a digital data by minimizing, by an analog input module, the influence of noise inputted along with analog data.

In one general aspect of the present disclosure, a method for converting analog data to digital data for analog input module is provided, the method comprising: receiving, by an analog input module, an analog data; converting the inputted analog data to a digital data (D1) as many as a predetermined n conversion times (n, said n being a natural number) for each data conversion period ($k^{th}$, the k being a natural number); obtaining at least one or more final conversion data (D2)

determined for previous conversion periods ($k-1^{th}, \ldots k-d^{th}$, said d being a natural number); sorting the converted n numbers of digital data (D1) and the obtained at least one or more final conversion data (D2) in the order of size; determining a value corresponding to a mean level among the sorted data as a final conversion data (D3) of the current conversion period; and outputting the determined final conversion data (D3).

In some exemplary embodiments of the present disclosure, the step of obtaining at least one or more final conversion data (D2) may include obtaining the final conversion data (D2) determined for previous conversion periods ($k-1^{th}, \ldots k-d^{th}$) as many as m numbers (d) corresponding to n<m<2n (m being a natural number) based on the current conversion period ($k^{th}$).

In some exemplary embodiments of the present disclosure, the method may further comprise storing the final conversion data (D3) subsequent to output of the final conversion data (D3).

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

Accompanying drawings are included to provide a further understanding of arrangements and embodiments of the present disclosure and are incorporated in and constitute a part of this application. In the following drawings, like reference numerals refer to like elements and wherein.

DETAILED DESCRIPTION

Figure 1:
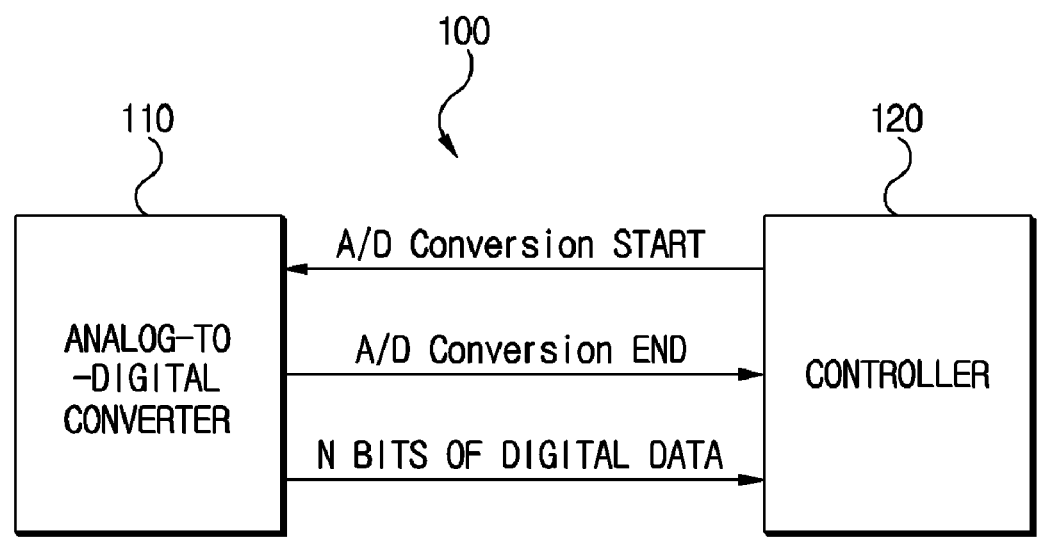
FIG. 1 is a block diagram illustrating a configuration of an analog input module according to an exemplary embodiment of the present disclosure.

A method for converting analog data to digital data for analog input module according to the present disclosure will be described in detail with reference to the accompanying drawings.

The same reference symbols identify the same or corresponding elements in the drawings. For the purposes of clarity and simplicity, detailed descriptions of constructions or processes known in the art may be omitted to avoid obscuring the disclosure in unnecessary detail.

The suffixes 'module', 'unit' and 'part' may be used for elements in order to facilitate the disclosure. Significant meanings or roles may not be given to the suffixes themselves and it is understood that the 'module', 'unit' and 'part' may be used together or interchangeably.

Furthermore, to the extent that the term "includes" is used in either the detailed description or the claims, such term is intended to be inclusive in a manner similar to the term "comprising" as "comprising" is interpreted when employed as a transitional word in a claim.

FIG. 1 is a block diagram illustrating a configuration of an analog input module according to an exemplary embodiment of the present disclosure.

An analog input module (100) according to the present disclosure may comprise an analog-to-digital converter (ADC. 110), and a controller (120). The ADC (110) receives an analog input signal and converts the analog input signal to a digital signal.

Furthermore, the controller (120) functions to control operations of the ADC (110), to store and process a digital data converted by the ADC (110). The controller (120) also functions to transmit an 'A/D Conversion START' signal for notifying the start of analog-to-digital conversion process to the ADC (110). By this, the ADC (110) converts the inputted analog signal to a digital data of N (natural number) bits. Thereafter, the ADC (110) transmits an 'A/D Conversion END' signal for notifying the end of analog-to-digital conversion process to the controller (120), if the analog-to-digital conversion process is finished. That is, if the analog-to-digital conversion process is finished, the ADC (110) transmits the converted N bits of digital data to the controller (120), where the analog input module according to the present disclosure repeats the above-mentioned process as many as predetermined conversion times (n).

At this time, the repetition of the above-mentioned process is realized within a predetermined conversion time of the analog input module. Therefore, the conversion times (n) are determined in consideration of the conversion time. The controller (120) uses the converted digital data to perform the function of converting a final conversion data through a predetermined process, the process of which will be described in detail with reference to FIG. 2.

Figure 2:
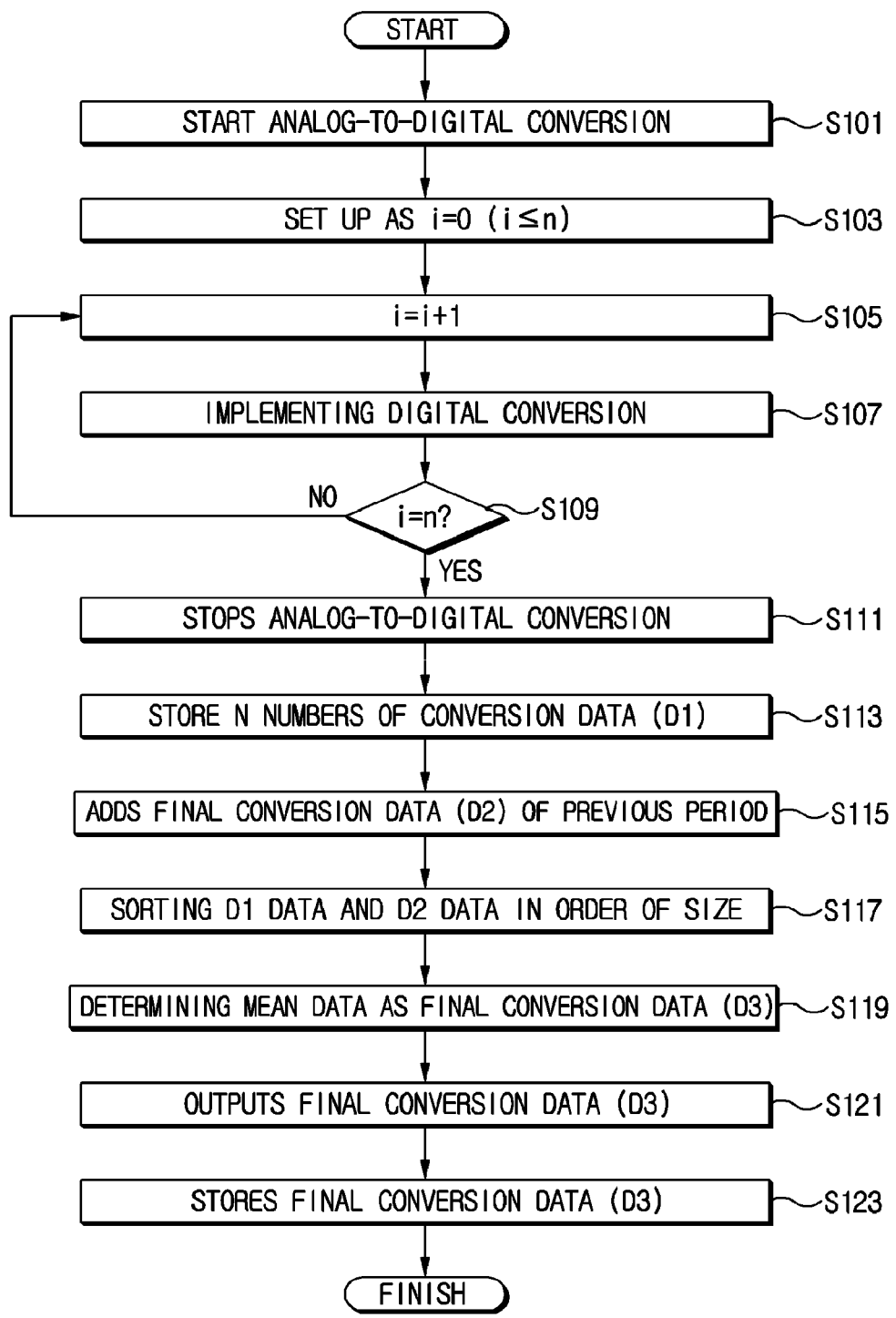
FIG. 2 is a flow chart illustrating a method for converting analog data to digital data for analog input module according to an exemplary embodiment of the present disclosure.

FIG. 2 is a flow chart illustrating a method for converting analog data to digital data for analog input module according to an exemplary embodiment of the present disclosure.

Referring to FIG. 2, a method for converting analog data into digital data for analog input module according to the present disclosure may largely comprise two processes, that is, an analog-to-digital conversion process (A), and a conversion data process (B).

First, in the analog-to-digital conversion process (A), if the analog input module starts the analog-to-digital conversion (S101), performs an initialization of i=0 (i≦n, where n is a natural number indicating conversion times) (S103), and increases i as much as 1 (S105) to perform the analog-to-digital conversion (S107). Successively, the analog input module determines if i=n (S109), and if it is determined that i=n, ends the analog-to-digital conversion (S111), and if it is determined that i≠n, repeats the abovementioned processes (S105~S109), whereby nth analog-to-digital conversion is implemented. It should be apparent that the nth conversion is implemented within a predetermined time given to the analog input module. Therefore, the nth conversion is implemented free from data conversion speed of the analog input module.

Next, with reference to the conversion data process (B), if the analog-to-digital conversion is ended (S111) as noted above, the analog input module stores n numbers of digital data (D1) converted in the current data conversion period (kth, where k is a natural number) (S113). Successively, the analog input module adds at least one or more final conversion data (D2) determined by previous conversion periods to n numbers of digital data (D1) stored in the S113 step (S115).

Preferably, the analog input module adds the final conversion data (D2) at previous periods (k−1$^{th}$, ... k−d$^{th}$) corresponding to m numbers (d, where d is a natural number) satisfying the condition of n<m<2n (m, where m is a natural number). At this time, the final conversion data (D2) defines a digital conversion data finally determined at the previous periods (k−1$^{th}$, ... k−d$^{th}$) through the analog-to-digital conversion method of the present disclosure.

For example, if n is 3, m satisfying the condition of n<m<2n (m, m being a natural number) is 4 and 5, where the m numbers (d) is 2. Therefore, 2 final conversion data (D2) of the previous periods (k−1th, k−2th) can be obtained. In the same principle, if n is 4, m is 5, 6 and 7, where m numbers (d) is 3, and 3 final conversion data (D2) of the previous periods (k−1th, k−2th, k−3th) can be obtained. This is to provide a conversion result of the current conversion period (kth) free from signal delay lest the numbers (d) of the previous final conversion data surpass the conversion times (n) implemented at the current time, as long as the conversion result of the current conversion period (kth) results in all noises.

As a result, n is 3 in the above first example, and the inputted analog data are converted into digital data of 1,000, 999 and 998, and if previous (k−1th, k−2th) 2 final conversion data are 1,001 and 1,002, data used for determining the final conversion data at the current conversion period (kth) are 5 of 1,002, 1,001, 1000, 999 and 998.

Successively, a total of digital conversion data obtained in S115 is sorted based on size (S117). The sorting may use a predetermined sort algorithm. For example, bubble sort algorithm may be used. However, any sorting algorithm may be utilized. Therefore, if the data are sorted based on the size, the sorting would be made in the order of 998, 999, 1,000, 1,001 and 1,002.

Thereafter, a data corresponding to a most mean level value among the sorted data is determined as a final conversion data (D3) at the current conversion period (kth) (S119), which is in turn outputted (S121). In the above case, 1,000 is determined as the final conversion data (D3) at the current conversion period (kth) and outputted. At this time, the data corresponding to the mean level value is a value different from an average value.

Successively, the final conversion data (D3) is stored to be used as kth final conversion data (D3) at next conversion period (k+1th) (S123).

As noted above, in the present disclosure, final conversion data of previous conversion periods (k−1th, ... k−dth) corresponding to m-indicated numbers (d) are included in n numbers of conversion data of current conversion period (kth) and sorted, and a data corresponding to a mean level in value size is determined as a final conversion data.

Therefore, even if the n numbers of digital data converted at the current conversion period (kth) are greatly deviated from an original value by noise, a stable result having a minimum influence by the noise can be provided by allowing a digital data value approximate to the original value to be outputted.

Figure 3:
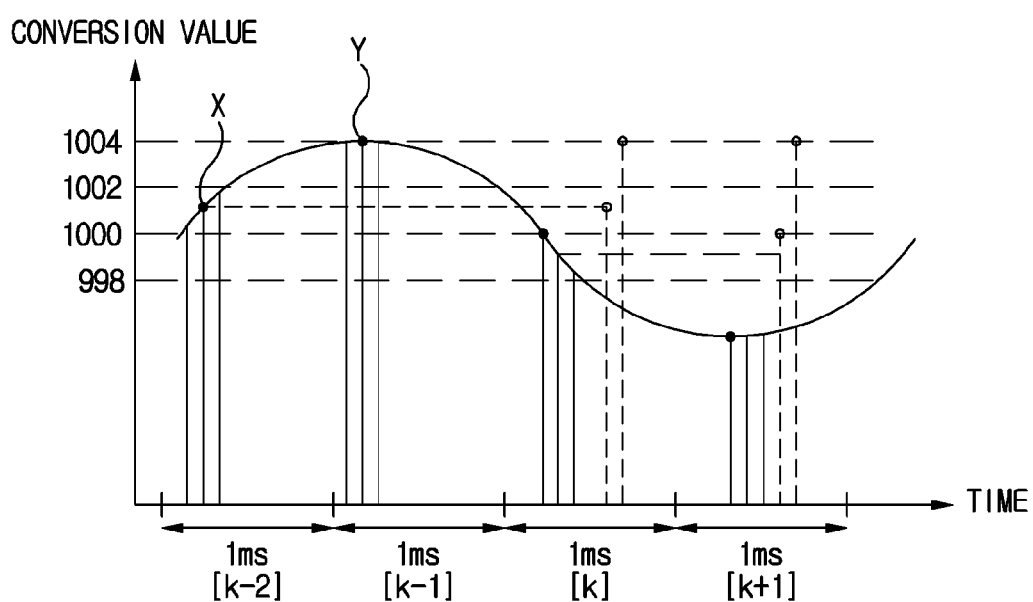
FIG. 3 is a graph illustrating an example for explaining a method for converting analog data to digital data for analog input module according to an exemplary embodiment of the present disclosure.

FIG. 3 is a graph illustrating an example for explaining a method for converting analog data to digital data for analog input module according to an exemplary embodiment of the present disclosure.

Referring to FIG. 3, assuming that conversion times (n) is 3 times, and a conversion time of the analog input module is 1 ms in the present exemplary embodiment, 3 digital conversion data can be generated at the conversion period of 1 ms. In the exemplary embodiment illustrated in FIG. 3, the conversion data generated at [k]th would be 998, 999 and 1,000 in that order. At this time, because m is 4 and 5 in the condition of n<m<2n, 2 final conversion data determined at the previous conversion periods ([k−1]th, [k−2]th) are added to the 3 conversion data of 998, 999 and 1,000.

As shown in FIG. 3, each [k−1]th final conversion data is 1,004, and [k−2]th final conversion data is 1,001. Therefore, data used for determining [k]th final conversion data would be 998, 999, 1,000, 1,004 and 1,001. If the data are sorted in the order of size, the data would be now 998, 999, 1,000, 1,001 and 1,004. The [k]th final conversion data would be 1,000, which is a mean level value among the data, and the analog input module outputs 1,000 as the [k]th final conversion data. Furthermore, said 1,000, which is the [k]th final conversion data, is used as a final conversion data of previous conversion period at the [k+1]th.

In the exemplary embodiment shown in FIG. 3, assuming that the second and third data among the 3 [k]th data become irrelevant, e.g., 10,000 and 20,000, a total conversion data would be 10,000, 20,000, 998, 1,001 and 1,004, and 10,000 and 20,000 would be eliminated by sorting, whereby a stable conversion result can be obtained. As noted, unless the digital conversion data all become irrelevant due to noise, the stable conversion result can be achieved free from signal delay.

In the present disclosure, if the condition of n<m<2n is not met, and a condition of m≧2n is set up, delays may be generated in implementing the digital conversion due to high probability in applying the final conversion data of the previous conversion periods (k−1th, ... k−dth) in determining the final conversion data of the current conversion period (kth).

Through the above-mentioned operations, the analog input module according to the present disclosure can output a stable digital data that receives a least noise influence at a predetermined digital conversion speed. As a result, stability in the analog-to-digital data conversion can be guaranteed in the industrial field where many noises are rushed in. Furthermore, the present disclosure can be usefully applied to a market needing a high speed data application due to accurate and fast analog-to-digital data conversion.

Although the present disclosure has been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for converting an analog input signal received by an analog input module to digital data, the method comprising:

receiving, by the analog input module, the analog input signal;

converting the analog input signal to a digital data (D1) and storing the digital data (D1) as many as n times for each data conversion period, where n is equal to or greater than 1;

supplementing at least one or more final conversion data (D2) determined by previous conversion periods to n number of digital data;

sorting the converted n number of digital data (D1) and the supplemented at least one or more final conversion data (D2) in the order of size;

determining a value corresponding to an intermediate value among the sorted data as a final conversion data (D3) of the current conversion period;

outputting the final conversion data (D3); and storing the final conversion data (D3) for a next period.

2. The method of claim 1, wherein supplementing the at least one or more final conversion data (D2) includes supplementing the at least one or more final conversion data (D2) determined by the previous conversion periods based on the current conversion period.

* * * * *